United States Patent
Shen et al.

(10) Patent No.: US 9,142,533 B2
(45) Date of Patent: Sep. 22, 2015

(54) SUBSTRATE INTERCONNECTIONS HAVING DIFFERENT SIZES

(75) Inventors: Wen-Wei Shen, Xinzhuang (TW); Ying-Ching Shih, Taipei (TW); Chen-Shien Chen, Zhubei (TW); Ming-Fa Chen, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 402 days.

(21) Appl. No.: 12/784,266

(22) Filed: May 20, 2010

(65) Prior Publication Data

US 2011/0285023 A1 Nov. 24, 2011

(51) Int. Cl.
*H01L 25/065* (2006.01)
*H01L 25/00* (2006.01)
(Continued)

(52) U.S. Cl.
CPC ...... *H01L 25/0657* (2013.01); *H01L 23/49811* (2013.01); *H01L 24/11* (2013.01); *H01L 24/13* (2013.01); *H01L 24/14* (2013.01); *H01L 24/81* (2013.01); *H01L 25/0655* (2013.01); *H01L 25/50* (2013.01); *H01L 23/3114* (2013.01); *H01L 23/3192* (2013.01); *H01L 24/03* (2013.01); *H01L 24/05* (2013.01); *H01L 24/16* (2013.01); *H01L 24/73* (2013.01); *H01L 2224/0345* (2013.01); *H01L 2224/0381* (2013.01); *H01L 2224/03452* (2013.01); *H01L 2224/03831* (2013.01); *H01L 2224/0401* (2013.01); *H01L 2224/0557* (2013.01); *H01L 2224/05572* (2013.01); *H01L 2224/05647* (2013.01); *H01L 2224/05666* (2013.01); *H01L 2224/05681* (2013.01); *H01L 2224/1145* (2013.01);

(Continued)

(58) Field of Classification Search
CPC ........................................................ H01L 25/50
USPC .................. 257/737, 773, E23.079, E21.705, 257/E21.507, E21.499, E23.151; 438/106–107, 121
See application file for complete search history.

(56) References Cited

U.S. PATENT DOCUMENTS

| 4,811,082 A | 3/1989 | Jacobs et al. |
| 4,990,462 A | 2/1991 | Sliwa, Jr. |

(Continued)

FOREIGN PATENT DOCUMENTS

| CN | 101080138 A | 11/2007 |
| KR | 1020110002816 A | 1/2011 |

(Continued)

OTHER PUBLICATIONS

Garrou, Phil, "IFTLE 58 Fine Pitch Microjoints, Cu Pillar Bump-on-Lead, Xillinx Interposer Reliability," Solid State Technology, Insights for Electronic Manufacturing, Jul. 18, 2011, 3 pages.

*Primary Examiner* — Yu-Hsi D Sun
*Assistant Examiner* — Ankush Singal
(74) *Attorney, Agent, or Firm* — Slater & Matsil, L.L.P.

(57) ABSTRACT

A bump structure that may be used to interconnect one substrate to another substrate is provided. A conductive pillar is formed on a first substrate such that the conductive pillar has a width different than a contact surface on a second substrate. In an embodiment the conductive pillar of the first substrate has a trapezoidal shape or a shape having tapered sidewalls, thereby providing a conductive pillar having base portion wider than a tip portion. The substrates may each be an integrated circuit die, an interposer, a printed circuit board, a high-density interconnect, or the like.

19 Claims, 8 Drawing Sheets

(51) Int. Cl.
*H01L 23/498* (2006.01)
*H01L 23/31* (2006.01)
*H01L 23/00* (2006.01)

(52) U.S. Cl.
CPC .......... *H01L 2224/1162* (2013.01); *H01L 2224/1181* (2013.01); *H01L 2224/11452* (2013.01); *H01L 2224/11462* (2013.01); *H01L 2224/11464* (2013.01); *H01L 2224/11622* (2013.01); *H01L 2224/11849* (2013.01); *H01L 2224/11903* (2013.01); *H01L 2224/13016* (2013.01); *H01L 2224/13025* (2013.01); *H01L 2224/1354* (2013.01); *H01L 2224/13084* (2013.01); *H01L 2224/13111* (2013.01); *H01L 2224/13116* (2013.01); *H01L 2224/13139* (2013.01); *H01L 2224/13144* (2013.01); *H01L 2224/13155* (2013.01); *H01L 2224/13169* (2013.01); *H01L 2224/1403* (2013.01); *H01L 2224/14181* (2013.01); *H01L 2224/16145* (2013.01); *H01L 2224/16225* (2013.01); *H01L 2224/16227* (2013.01); *H01L 2224/73204* (2013.01); *H01L 2224/81193* (2013.01); *H01L 2225/06513* (2013.01); *H01L 2225/06517* (2013.01); *H01L 2225/06541* (2013.01); *H01L 2225/06548* (2013.01); *H01L 2225/06568* (2013.01); *H01L 2924/0002* (2013.01); *H01L 2924/014* (2013.01); *H01L 2924/0105* (2013.01); *H01L 2924/01006* (2013.01); *H01L 2924/01013* (2013.01); *H01L 2924/01019* (2013.01); *H01L 2924/01029* (2013.01); *H01L 2924/01033* (2013.01); *H01L 2924/01047* (2013.01); *H01L 2924/01073* (2013.01); *H01L 2924/01074* (2013.01); *H01L 2924/01075* (2013.01); *H01L 2924/01078* (2013.01); *H01L 2924/01079* (2013.01); *H01L 2924/01082* (2013.01)

(56) References Cited

U.S. PATENT DOCUMENTS

| Patent No. | | Date | Name | Cite |
|---|---|---|---|---|
| 5,075,253 | A | 12/1991 | Sliwa, Jr. | |
| 5,075,965 | A * | 12/1991 | Carey et al. | 29/840 |
| 5,130,779 | A * | 7/1992 | Agarwala et al. | 257/772 |
| 5,277,756 | A * | 1/1994 | Dion | 438/754 |
| 5,334,804 | A * | 8/1994 | Love et al. | 174/267 |
| 5,380,681 | A | 1/1995 | Hsu | |
| 5,431,328 | A * | 7/1995 | Chang et al. | 228/180.22 |
| 5,440,239 | A * | 8/1995 | Zappella et al. | 324/756.03 |
| 5,470,787 | A * | 11/1995 | Greer | 438/614 |
| 5,481,133 | A | 1/1996 | Hsu | |
| 5,542,601 | A | 8/1996 | Fallon et al. | |
| 5,587,337 | A | 12/1996 | Idaka et al. | |
| 5,680,187 | A * | 10/1997 | Nagayama et al. | 349/110 |
| 5,790,377 | A * | 8/1998 | Schreiber et al. | 361/704 |
| 5,796,591 | A * | 8/1998 | Dalal et al. | 361/779 |
| 5,816,478 | A * | 10/1998 | Kaskoun et al. | 228/180.22 |
| 5,889,326 | A | 3/1999 | Tanaka | |
| 5,977,599 | A * | 11/1999 | Adrian | 257/382 |
| 6,002,172 | A * | 12/1999 | Desai et al. | 257/737 |
| 6,002,177 | A | 12/1999 | Gaynes et al. | |
| 6,025,650 | A | 2/2000 | Tsuji et al. | |
| 6,082,610 | A * | 7/2000 | Shangguan et al. | 228/180.22 |
| 6,091,141 | A | 7/2000 | Heo | |
| 6,130,476 | A * | 10/2000 | LaFontaine et al. | 257/678 |
| 6,137,184 | A * | 10/2000 | Ikegami | 257/785 |
| 6,181,010 | B1 * | 1/2001 | Nozawa | 257/737 |
| 6,187,678 | B1 | 2/2001 | Gaynes et al. | |
| 6,229,216 | B1 | 5/2001 | Ma et al. | |
| 6,236,115 | B1 | 5/2001 | Gaynes et al. | |
| 6,249,051 | B1 * | 6/2001 | Chang et al. | 257/737 |
| 6,250,541 | B1 * | 6/2001 | Shangguan et al. | 228/208 |
| 6,271,059 | B1 | 8/2001 | Bertin et al. | |
| 6,279,815 | B1 | 8/2001 | Correia et al. | |
| 6,291,891 | B1 * | 9/2001 | Higashi et al. | 257/774 |
| 6,346,469 | B1 * | 2/2002 | Greer | 438/614 |
| 6,355,501 | B1 | 3/2002 | Fung et al. | |
| 6,358,847 | B1 | 3/2002 | Li et al. | |
| 6,424,037 | B1 * | 7/2002 | Ho et al. | 257/738 |
| 6,434,016 | B2 | 8/2002 | Zeng et al. | |
| 6,448,661 | B1 | 9/2002 | Kim et al. | |
| 6,461,895 | B1 | 10/2002 | Liang et al. | |
| 6,492,197 | B1 * | 12/2002 | Rinne | 438/108 |
| 6,498,308 | B2 * | 12/2002 | Sakamoto | 174/260 |
| 6,562,653 | B1 | 5/2003 | Ma et al. | |
| 6,562,657 | B1 * | 5/2003 | Lin | 438/113 |
| 6,570,248 | B1 | 5/2003 | Ahn et al. | |
| 6,573,598 | B2 * | 6/2003 | Ohuchi et al. | 257/734 |
| 6,578,754 | B1 * | 6/2003 | Tung | 228/180.22 |
| 6,583,846 | B1 * | 6/2003 | Yanagawa et al. | 349/155 |
| 6,592,019 | B2 * | 7/2003 | Tung | 228/197 |
| 6,600,222 | B1 | 7/2003 | Levardo | |
| 6,607,938 | B2 | 8/2003 | Kwon et al. | |
| 6,661,085 | B2 | 12/2003 | Kellar et al. | |
| 6,713,844 | B2 * | 3/2004 | Tatsuta et al. | 257/629 |
| 6,762,076 | B2 | 7/2004 | Kim et al. | |
| 6,790,748 | B2 | 9/2004 | Kim et al. | |
| 6,887,769 | B2 | 5/2005 | Kellar et al. | |
| 6,908,565 | B2 | 6/2005 | Kim et al. | |
| 6,908,785 | B2 | 6/2005 | Kim | |
| 6,924,551 | B2 | 8/2005 | Rumer et al. | |
| 6,940,169 | B2 * | 9/2005 | Jin et al. | 257/738 |
| 6,940,178 | B2 * | 9/2005 | Kweon et al. | 257/780 |
| 6,943,067 | B2 | 9/2005 | Greenlaw | |
| 6,946,384 | B2 | 9/2005 | Kloster et al. | |
| 6,972,490 | B2 * | 12/2005 | Chang et al. | 257/737 |
| 6,975,016 | B2 | 12/2005 | Kellar et al. | |
| 6,998,216 | B2 * | 2/2006 | He et al. | 430/296 |
| 7,037,804 | B2 | 5/2006 | Kellar et al. | |
| 7,056,807 | B2 | 6/2006 | Kellar et al. | |
| 7,087,538 | B2 | 8/2006 | Staines et al. | |
| 7,135,766 | B1 * | 11/2006 | Costa et al. | 257/700 |
| 7,151,009 | B2 | 12/2006 | Kim et al. | |
| 7,157,787 | B2 | 1/2007 | Kim et al. | |
| 7,215,033 | B2 | 5/2007 | Lee et al. | |
| 7,251,484 | B2 | 7/2007 | Aslanian | |
| 7,271,483 | B2 * | 9/2007 | Lin et al. | 257/737 |
| 7,276,799 | B2 | 10/2007 | Lee et al. | |
| 7,279,795 | B2 | 10/2007 | Periaman et al. | |
| 7,307,005 | B2 | 12/2007 | Kobrinsky et al. | |
| 7,317,256 | B2 | 1/2008 | Williams et al. | |
| 7,320,928 | B2 | 1/2008 | Kloster et al. | |
| 7,345,350 | B2 | 3/2008 | Sinha | |
| 7,382,049 | B2 * | 6/2008 | Ho et al. | 257/737 |
| 7,402,442 | B2 | 7/2008 | Condorelli et al. | |
| 7,402,508 | B2 * | 7/2008 | Kaneko | 438/613 |
| 7,402,515 | B2 | 7/2008 | Arana et al. | |
| 7,410,884 | B2 | 8/2008 | Ramanathan et al. | |
| 7,432,592 | B2 | 10/2008 | Shi et al. | |
| 7,459,785 | B2 * | 12/2008 | Daubenspeck et al. | 257/738 |
| 7,470,996 | B2 * | 12/2008 | Yoneyama et al. | 257/780 |
| 7,494,845 | B2 | 2/2009 | Hwang et al. | |
| 7,495,179 | B2 | 2/2009 | Kubota et al. | 174/260 |
| 7,528,494 | B2 | 5/2009 | Furukawa et al. | |
| 7,531,890 | B2 | 5/2009 | Kim | |
| 7,554,201 | B2 * | 6/2009 | Kang et al. | 257/772 |
| 7,557,597 | B2 | 7/2009 | Anderson et al. | |
| 7,576,435 | B2 | 8/2009 | Chao | |
| 7,659,631 | B2 * | 2/2010 | Kamins et al. | 257/775 |
| 7,804,177 | B2 | 9/2010 | Lu et al. | |
| 7,834,450 | B2 | 11/2010 | Kang | |
| 7,946,331 | B2 * | 5/2011 | Trezza et al. | 156/581 |
| 8,076,232 | B2 * | 12/2011 | Pendse | 438/612 |
| 8,093,729 | B2 * | 1/2012 | Trezza | 257/781 |
| 8,120,175 | B2 * | 2/2012 | Farooq et al. | 257/737 |
| 8,130,475 | B2 * | 3/2012 | Kawamori et al. | 360/324.12 |
| 8,158,489 | B2 * | 4/2012 | Huang et al. | 438/455 |
| 8,207,604 | B2 * | 6/2012 | Haba et al. | 257/690 |
| 8,232,640 | B2 * | 7/2012 | Tomoda et al. | 257/737 |
| 8,435,881 | B2 * | 5/2013 | Choi et al. | 438/612 |

(56) References Cited

U.S. PATENT DOCUMENTS

| | | | |
|---|---|---|---|
| 2001/0013423 A1* | 8/2001 | Dalal et al. | 174/260 |
| 2001/0038147 A1* | 11/2001 | Higashi et al. | 257/750 |
| 2002/0033412 A1* | 3/2002 | Tung | 228/215 |
| 2002/0100974 A1* | 8/2002 | Uchiyama | 257/737 |
| 2002/0106832 A1* | 8/2002 | Hotchkiss et al. | 438/108 |
| 2002/0197811 A1* | 12/2002 | Sato | 438/330 |
| 2003/0092219 A1* | 5/2003 | Ohuchi et al. | 438/110 |
| 2004/0140538 A1* | 7/2004 | Harvey | 257/666 |
| 2004/0159944 A1* | 8/2004 | Datta et al. | 257/737 |
| 2004/0212098 A1* | 10/2004 | Pendse | 257/778 |
| 2005/0062153 A1* | 3/2005 | Saito et al. | 257/737 |
| 2005/0212114 A1* | 9/2005 | Kawano et al. | 257/690 |
| 2005/0224991 A1* | 10/2005 | Yeo | 257/781 |
| 2006/0012024 A1* | 1/2006 | Lin et al. | 257/692 |
| 2006/0038303 A1* | 2/2006 | Sterrett et al. | 257/779 |
| 2006/0051954 A1* | 3/2006 | Lin et al. | 438/614 |
| 2006/0055032 A1 | 3/2006 | Chang et al. | |
| 2006/0076677 A1* | 4/2006 | Daubenspeck et al. | 257/734 |
| 2006/0209245 A1* | 9/2006 | Mun et al. | 349/155 |
| 2006/0292824 A1 | 12/2006 | Beyne et al. | |
| 2007/0001280 A1* | 1/2007 | Hua | 257/686 |
| 2007/0012337 A1* | 1/2007 | Hillman et al. | 134/1.3 |
| 2007/0018294 A1* | 1/2007 | Sutardja | 257/678 |
| 2007/0020906 A1 | 1/2007 | Chiu et al. | |
| 2007/0023483 A1* | 2/2007 | Yoneyama et al. | 228/110.1 |
| 2007/0057022 A1* | 3/2007 | Mogami et al. | 228/101 |
| 2007/0200234 A1* | 8/2007 | Gerber et al. | 257/734 |
| 2008/0023850 A1* | 1/2008 | Lu et al. | 257/778 |
| 2008/0128911 A1 | 6/2008 | Koyama | |
| 2008/0150135 A1 | 6/2008 | Oyama et al. | |
| 2008/0218061 A1* | 9/2008 | Chao et al. | 313/504 |
| 2008/0277785 A1* | 11/2008 | Hwan et al. | 257/737 |
| 2009/0025215 A1* | 1/2009 | Murakami et al. | 29/846 |
| 2009/0042144 A1* | 2/2009 | Kitada et al. | 430/317 |
| 2009/0075469 A1* | 3/2009 | Furman et al. | 438/613 |
| 2009/0096092 A1* | 4/2009 | Patel | 257/737 |
| 2009/0108443 A1* | 4/2009 | Jiang | 257/737 |
| 2009/0149016 A1 | 6/2009 | Park et al. | |
| 2009/0166861 A1 | 7/2009 | Lehr et al. | |
| 2009/0174067 A1* | 7/2009 | Lin | 257/734 |
| 2009/0250814 A1 | 10/2009 | Pendse et al. | |
| 2010/0007019 A1* | 1/2010 | Pendse | 257/737 |
| 2010/0044860 A1* | 2/2010 | Haba et al. | 257/737 |
| 2010/0141880 A1* | 6/2010 | Koito et al. | 349/123 |
| 2010/0276787 A1* | 11/2010 | Yu et al. | 257/621 |
| 2010/0314745 A1 | 12/2010 | Masumoto et al. | |
| 2010/0327422 A1* | 12/2010 | Lee et al. | 257/690 |
| 2011/0001250 A1 | 1/2011 | Lin et al. | |
| 2011/0169158 A1 | 7/2011 | Varnasi | |
| 2011/0177686 A1 | 7/2011 | Zeng et al. | |
| 2011/0186986 A1* | 8/2011 | Chuang et al. | 257/737 |
| 2011/0193220 A1* | 8/2011 | Kuo et al. | 257/737 |
| 2011/0244675 A1 | 10/2011 | Huang et al. | |
| 2011/0260317 A1* | 10/2011 | Lu et al. | 257/737 |
| 2011/0285011 A1* | 11/2011 | Hwang et al. | 257/737 |
| 2011/0285023 A1 | 11/2011 | Shen et al. | |
| 2012/0007231 A1* | 1/2012 | Chang | 257/737 |
| 2012/0012997 A1* | 1/2012 | Shen et al. | 257/737 |
| 2012/0091577 A1* | 4/2012 | Hwang et al. | 257/737 |
| 2012/0098120 A1 | 4/2012 | Yu et al. | |
| 2012/0146168 A1* | 6/2012 | Hsieh et al. | 257/421 |
| 2012/0306080 A1* | 12/2012 | Yu et al. | 257/751 |
| 2013/0026622 A1 | 1/2013 | Chuang et al. | |
| 2013/0087920 A1 | 4/2013 | Jeng et al. | |
| 2013/0093079 A1 | 4/2013 | Tu et al. | |
| 2013/0270699 A1 | 10/2013 | Kuo et al. | |
| 2013/0277830 A1 | 10/2013 | Yu et al. | |
| 2013/0288473 A1 | 10/2013 | Chuang et al. | |
| 2014/0054764 A1 | 2/2014 | Lu et al. | |
| 2014/0061897 A1 | 3/2014 | Lin et al. | |
| 2014/0061924 A1 | 3/2014 | Chen et al. | |
| 2014/0077358 A1 | 3/2014 | Chen et al. | |
| 2014/0077360 A1 | 3/2014 | Lin et al. | |
| 2014/0077365 A1 | 3/2014 | Lin et al. | |

FOREIGN PATENT DOCUMENTS

| | | |
|---|---|---|
| KR | 1020110128532 A | 11/2011 |
| TW | 200826265 A | 6/2008 |
| TW | 200915452 A | 4/2009 |
| TW | 201133662 | 10/2011 |

* cited by examiner

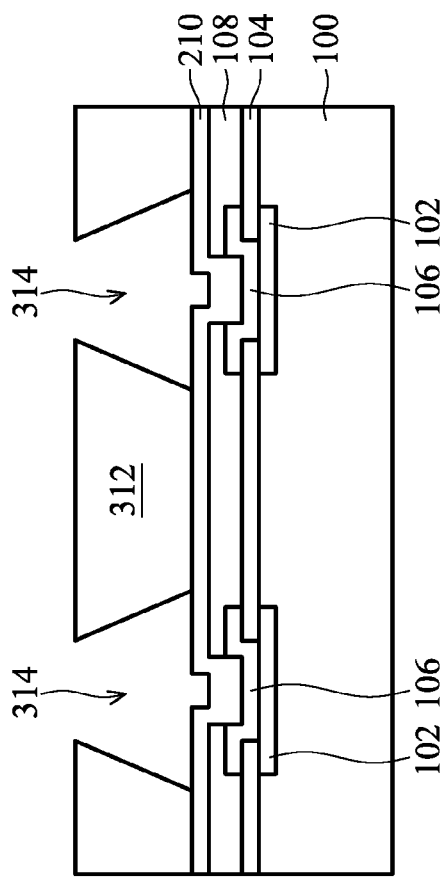
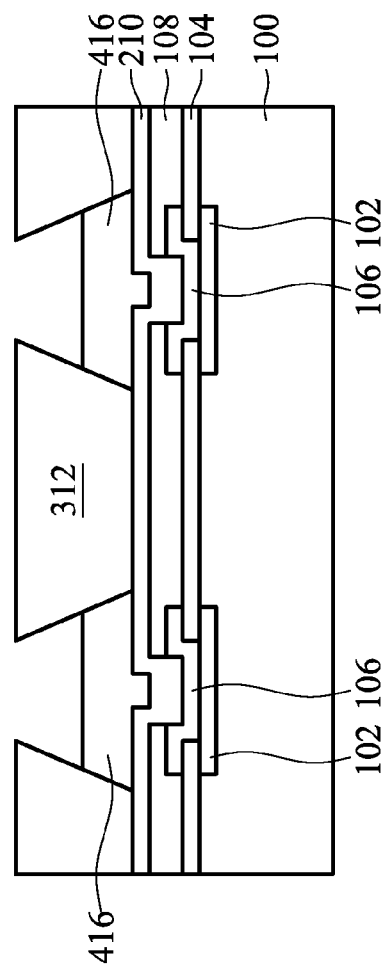
Fig. 3
Fig. 4

SUBSTRATE INTERCONNECTIONS HAVING DIFFERENT SIZES

TECHNICAL FIELD

This disclosure relates generally to integrated circuits and, more particularly, to bump structures for use with semiconductor dies.

BACKGROUND

Since the invention of the integrated circuit, the semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D integrated circuit (IC) formation, there are physical limits to the density that can be achieved in two dimensions. One of these limits is the minimum size needed to make these components. Also, when more devices are put into one chip, more complex designs are required.

In an attempt to further increase circuit density, three-dimensional (3D) ICs have been investigated. In a typical formation process of a 3D IC, two dies are bonded together and electrical connections are formed between each die and contact pads on a substrate. For example, one attempt involved bonding two dies on top of each other. The stacked dies were then bonded to a carrier substrate and wire bonds electrically coupled contact pads on each die to contact pads on the carrier substrate. This attempt, however, requires a carrier substrate larger than the dies for the wire bonding.

More recent attempts have focused on flip-chip interconnections and the use of conductive balls/bumps to form a connection between the die and the underlying substrate, thereby allowing high-wiring density in a relatively small package. In this situation, a conductive bump is formed on one surface and direct contact is made with a post or pad on the other surface. Misalignment, however, often occurs between the contacts on the opposing surfaces. The misalignment may result in shorts between contacts and/or damage to the devices.

Furthermore, the difference in materials and the respective coefficient of thermal expansion (CTE) values creates stress in the joint region. The stress may cause the joint to crack and/or cause other problems, such as delamination issues of the dielectric layers.

SUMMARY

In accordance with an embodiment, a device having a first substrate connected to a second substrate is provided, wherein the contact surfaces of the first substrate and the second substrate have different widths. In an embodiment, one of the first substrate and the second substrate may have a conductive pillar such that the conductive pillar has a trapezoidal shape or a shape having tapered sidewalls. The conductive pillar may include a cap layer. The substrates may each be an integrated circuit die, an interposer, a printed circuit board, a high-density interconnect, or the like.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1-7 illustrate intermediate stages in forming a semiconductor device having a bump structure in accordance with an embodiment;

DETAILED DESCRIPTION

The making and using of embodiments are discussed in detail below. It should be appreciated, however, that this disclosure provides many applicable inventive concepts that can be embodied in a wide variety of specific contexts. The specific embodiments discussed herein are merely illustrative of specific ways to make and use the embodiments, and do not limit the scope of the disclosure.

Embodiments described herein relate to the use of bumps or balls (collectively referred to herein as bumps) for use with interconnecting one substrate with another substrate, wherein each substrate may be an integrated circuit die, an interposer, packaging substrate, printed circuit board, high-density interconnect, or the like. As will be discussed below, embodiments are disclosed that utilize a bump having a trapezoidal shape. It has been found that embodiments such as those discussed herein may reduce misalignment, thereby increasing throughput and reliability. The intermediate stages of a method for forming a bump are disclosed herein. Embodiments such as these may be suitable for use in three-dimensional (3D) integrated circuit (IC) or stacked die configurations. Throughout the various views and illustrative embodiments, like reference numbers are used to designate like elements.

Figure 1:
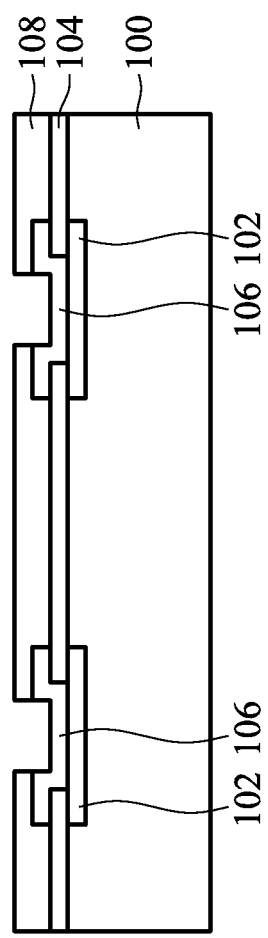

FIGS. 1-7 illustrate various intermediate stages of a method of forming a semiconductor device having a bump with a trapezoidal shape in accordance with an embodiment. Referring first to FIG. 1, a portion of a substrate 100 is shown in accordance with an embodiment. The substrate 100 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as multi-layered or gradient substrates may also be used. In another embodiment, the substrate 100 may comprise a substrate to which an integrated circuit die may be attached. For example, the substrate 100 may be an interposer, a packaging substrate, a high-density interconnect, a printed circuit board, another integrated circuit die, or the like.

It should be noted that in some embodiments, particularly in embodiments in which the substrate 100 is an integrated circuit die, the substrate 100 may include electrical circuitry (not shown). In an embodiment, the electrical circuitry includes electrical devices formed on the substrate 100 with one or more dielectric layers overlying the electrical devices. Metal layers may be formed between dielectric layers to route electrical signals between the electrical devices. Electrical devices may also be formed in one or more dielectric layers. In an embodiment, the substrate 100 includes one or more low-k and/or extremely low-k dielectric layers.

For example, the electrical circuitry may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution circuitry, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

Conductive pads 102 are provided in an upper surface of the substrate 100 to provide external electrical connections. It should be noted that the conductive pads 102 represent an electrical connection to electrical circuitry formed on the substrate 100, an electrical connection to a through-substrate via, a redistribution line, and/or the like. The conductive pads 102 may comprise a conductive material such as copper, although other conductive materials, such as tungsten, aluminum, copper alloy, or the like, may alternatively be used. The conductive pads 102 may be formed using a damascene or dual damascene process which may include a copper overfill into an opening followed by the removal of the excess copper through a process such as chemical mechanical polishing (CMP). However, any suitable material (such as, e.g., aluminum) and any suitable process (such as deposition and etching) may alternatively be used to form the conductive pads 102.

A first passivation layer 104 may be formed of a dielectric material, such as polyimide, polymer, an oxide, a nitride, or the like, and patterned over the surface of the substrate 100 to provide an opening over the conductive pads 102 and to protect the underlying layers from various environmental contaminants. In an embodiment, the first passivation layer 104 comprises a composite layer of a layer of silicon nitride and an oxide layer. The silicon nitride layer may be formed using CVD techniques using silane and ammonia as precursor gases to a thickness of about 750 Å. The oxide layer may be formed by any oxidation process, such as wet or dry thermal oxidation in an ambient comprising an oxide, $H_2O$, NO, or a combination thereof, or by CVD techniques using tetra-ethyl-ortho-silicate (TEOS) and oxygen as a precursor. In an embodiment, the oxide layer has a thickness about 8,500 Å. Other materials, processes, and thicknesses may be used.

In an embodiment in which the first passivation layer 104 comprises a silicon nitride layer and an oxide layer, an opening may be formed exposing the conductive pads 102 using a wet etch process using phosphoric acid to etch the silicon nitride layer and a wet etch process in dilute hydrofluoric acid to etch the silicon dioxide.

Thereafter, bond pads 106 are formed and patterned over the first passivation layer 104. The bond pads 106 provide an electrical connection upon which a UBM structure may be formed for external connections in subsequent processing steps. The bond pads 106 may be formed of any suitable conductive material, such as copper, tungsten, aluminum, silver, combinations thereof, or the like.

One or more second passivation layers, such as a second passivation layer 108, are formed and patterned over the bond pads 106 as illustrated in FIG. 1. The second passivation layer 108 may be formed of a dielectric material, such as polymer, a nitride, an oxide, or the like, by any suitable method, such as CVD, physical vapor deposition (PVD), or the like. In an embodiment, the second passivation layer 108 is a composite layer comprising a plasma-enhanced silicon oxynitride (PE-SION) layer having a thickness of about 300 Å, an undoped silicate glass (USG) layer having a thickness of about 4,000 Å, and a plasma-enhanced silicon nitride (PESIN) layer having a thickness of about 6,000 Å.

One of ordinary skill in the art will appreciate that a single layer of conductive/bond pads and a passivation layer are shown for illustrative purposes only. As such, other embodiments may include any number of conductive layers and/or passivation layers. Furthermore, it should be appreciated that one or more of the conductive layers may act as a redistribution layer (RDL) to provide the desired pin or ball layout.

Any suitable process may be used to form the structures discussed above and will not be discussed in greater detail herein. As one of ordinary skill in the art will realize, the above description provides a general description of the features of the embodiment and that numerous other features may be present. For example, other circuitry, liners, barrier layers, under-bump metallization configurations, and the like, may be present. The above description is meant only to provide a context for embodiments discussed herein and is not meant to limit the disclosure or the scope of any claims to those specific embodiments.

Figure 2:
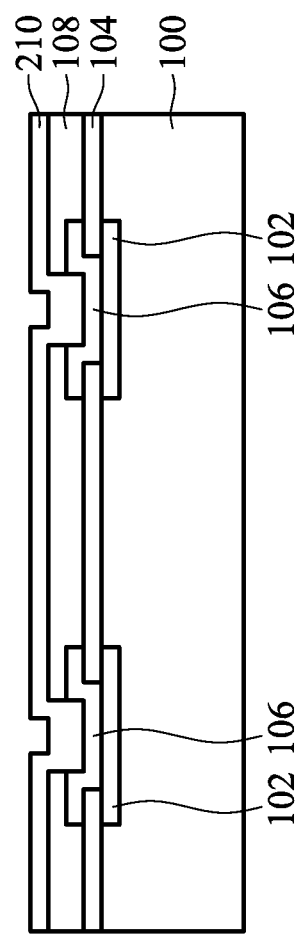

Referring now to FIG. 2, a conformal seed layer 210 is deposited over the surface of the second passivation layer 108 and the exposed portions of the bond pads 106. The seed layer 210 is a thin layer of a conductive material that aids in the formation of a thicker layer during subsequent processing steps. In an embodiment, the seed layer 210 may be formed by depositing a thin conductive layer, such as a thin layer of Cu, Ti, Ta, TiN, TaN, or the like, using CVD or PVD techniques. For example, in an embodiment, the seed layer 210 is a composite layer including a layer of Ti is deposited by a PVD process to a thickness of about 500 Å and a layer of Cu deposited by a PVD process to a thickness of about 3,000 Å. Other materials, processes, and thicknesses may be used.

FIG. 3 illustrates a first patterned mask 312 formed over the seed layer 210 in accordance with an embodiment. The first patterned mask 312 will act as a mold for forming conductive pillars in subsequent processing steps. The first patterned mask 312 may be a patterned photoresist mask, hard mask, or the like. In an embodiment, a photoresist material is deposited and patterned to form openings 314.

It should be noted that the embodiment illustrated in FIG. 3 utilizes sloped sidewalls such that the openings 314 are wider along the bottom of the openings along the seed layer 210 than the top portion of the openings 314, thereby resulting in a trapezoidal shape. The tapered profile may be created by any suitable technique, such as the use of multiple photoresist layers with different patterning properties and one or more exposures, diffusion techniques, an image reversal process, multiple exposures using different masks, or the like.

Thereafter, conductive pillar 416 is formed in the openings 314 (see FIG. 3) as illustrated in FIG. 4. The conductive pillar 416 comprises one or more conductive materials, such as copper, tungsten, other conductive metals, or the like, and may be formed, for example, by electroplating, electroless plating, or the like. In an embodiment, an electroplating process is used wherein the wafer is submerged or immersed in the electroplating solution. The wafer surface is electrically connected to the negative side of an external DC power supply such that the wafer functions as the cathode in the electroplating process. A solid conductive anode, such as a copper anode, is also immersed in the solution and is attached to the positive side of the power supply. The atoms from the anode are dissolved into the solution, from which the cathode, e.g., the wafer, acquires, thereby plating the exposed conductive areas of the wafer, e.g., exposed portions of the seed layer 210 within the openings 314.

Figure 5:
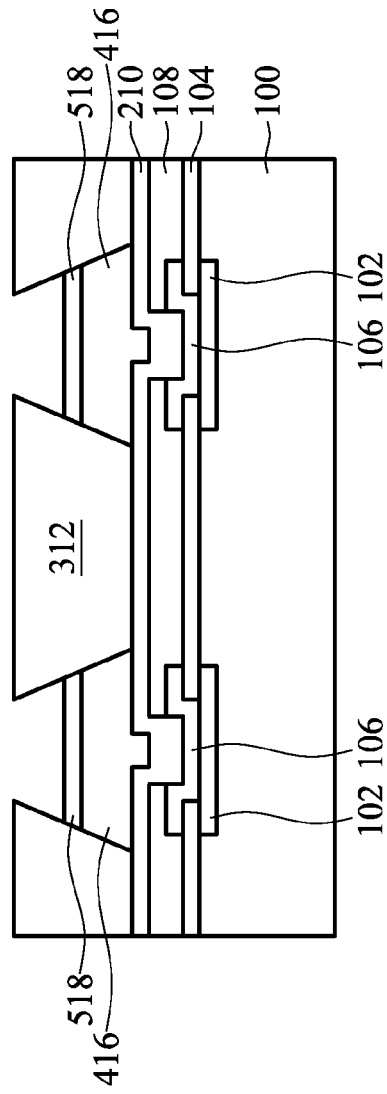

FIG. 5 illustrates formation of an optional conductive cap layer 518 formed over the conductive pillar 416. As described in greater detail below, solder material will be formed over the conductive pillar 416. During the soldering process, an intermetallic compound (IMC) layer is naturally formed at the joint between the solder material and the underlying surface. It has been found that some materials may create a stronger, more durable IMC layer than others. As such, it may be desirable to form a cap layer, such as the conductive cap layer 518, to provide an IMC layer having more desirable characteristics. For example, in an embodiment in which the conductive pillar 416 is formed of copper, a conductive cap layer 518 formed of nickel may be desirable. Other materials, such as Pt, Au, Ag, combinations thereof, or the like, may also be used. The conductive cap layer 518 may be formed through any number of suitable techniques, including PVD, CVD, ECD, MBE, ALD, electroplating, and the like.

Figure 6:
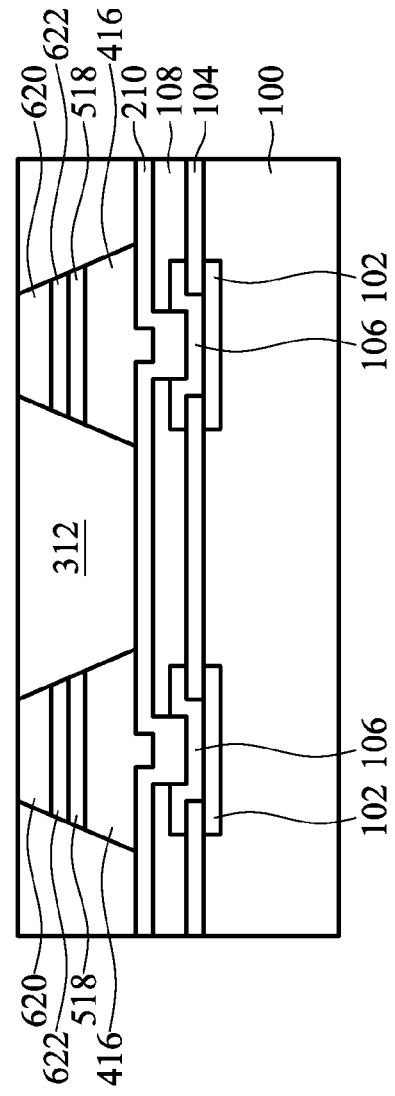

FIG. 6 illustrates formation of solder material 620 and an IMC layer 622. In an embodiment, the solder material 622 comprises SnPb, a high-Pb material, a Sn-based solder, a lead-free solder, or other suitable conductive material.

Figure 7:
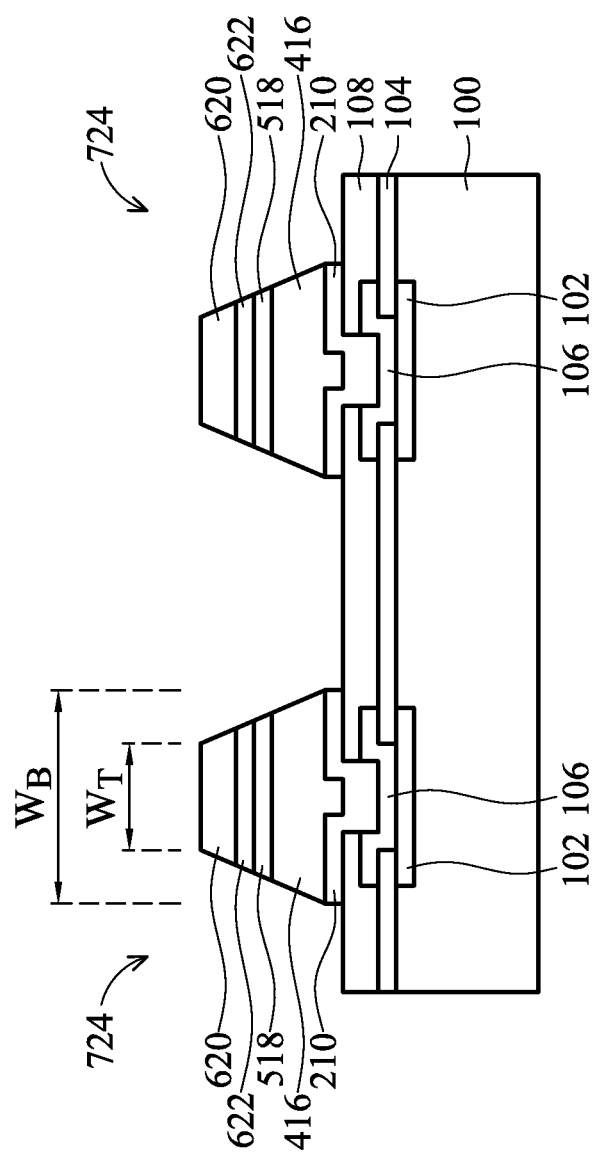

FIG. 7 illustrates the removal of the first patterned mask 312 (see FIG. 3) in accordance with an embodiment. In an embodiment in which the first patterned mask 312 is a photoresist mask, a plasma ashing or wet strip process may be used to remove the first patterned mask 312. One suitable plasma ashing process uses an $O_2$ flow rate of about 1000 sccm to about 2000 sccm at a pressure of about 300 mTorr to about 600 mTorr and at power of about 500 Watts to about 2000 Watts and at a temperature of about 80° C. to about 200° C., for example. The exposed portions of the seed layer 210 may be removed by, for example, a wet etching process. Optionally, a wet dip in a sulfuric acid ($H_2SO_4$) solution may be used to clean the wafer and remove remaining photoresist material. A reflow process may be performed, which may cause the solder material 620 to have a rounded shape.

The conductive pillar 416 and, optionally, the conductive cap layer 518 form a conductive bump 724 having a trapezoidal shape such that sidewalls of the conductive bump 724 are tapered. In this situation, a width of the base portion $W_B$ is greater than a width of the tip portion $W_T$. The relatively wide base dimension may reduce current density and the narrower top portion may reduce the probability of misalignment when coupling the first substrate 100 to another substrate.

Figure 9:
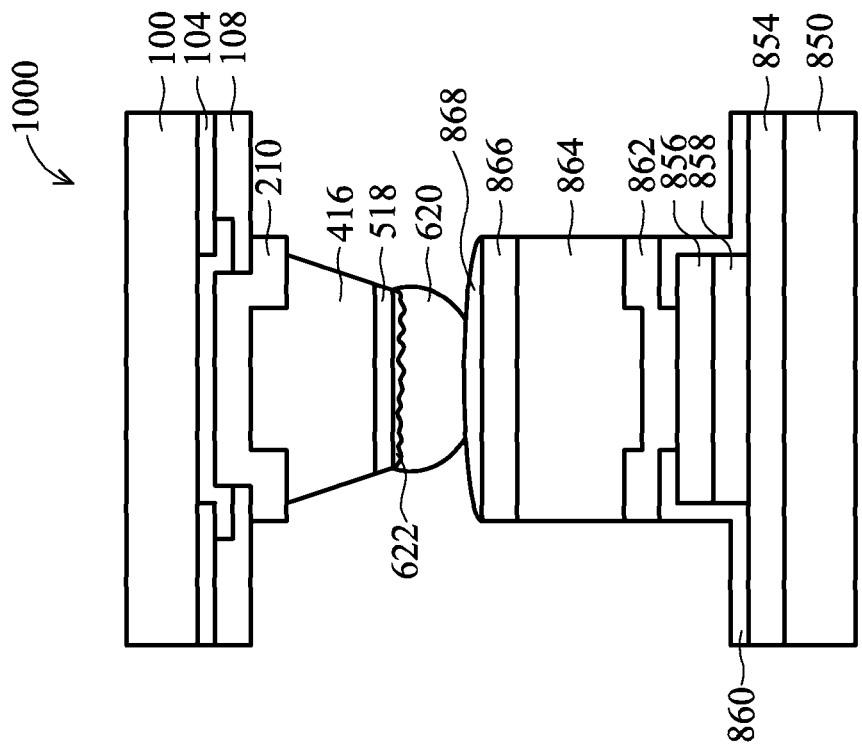
FIGS. 8 and 9 illustrate attaching two substrates in accordance with an embodiment.
Figure 8:
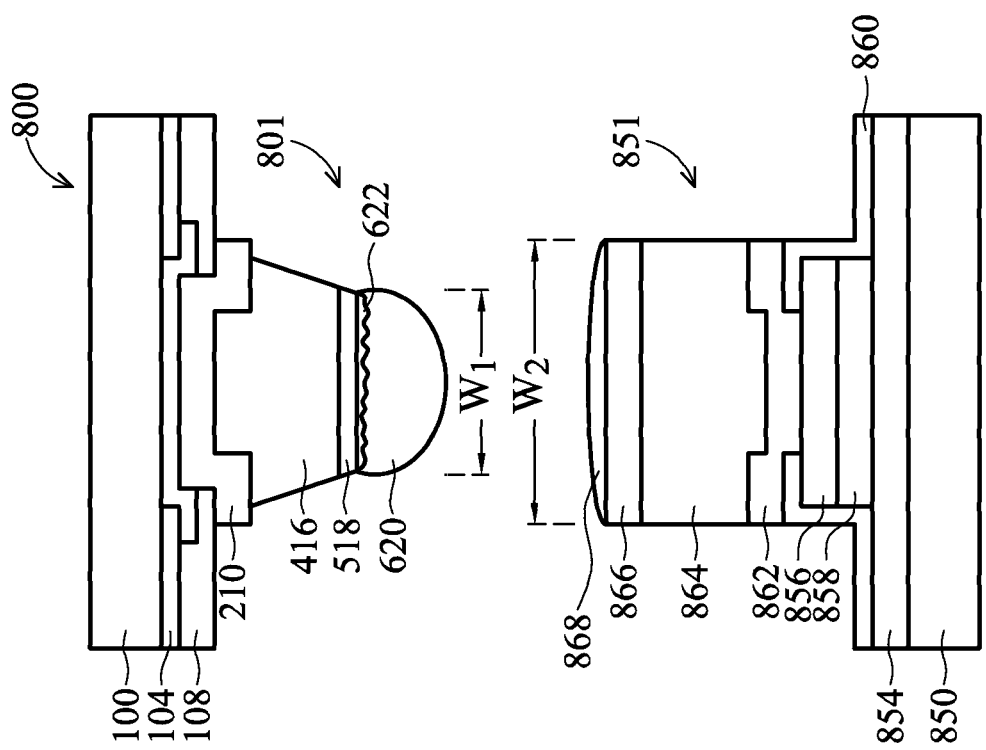

FIGS. 8-9 illustrate joining two substrates in accordance with an embodiment. The first substrate 800, having a first interconnect structure 801, represents a substrate such as the substrate 100 discussed above with reference to FIGS. 1-7, wherein like reference numerals refer to like elements. The second substrate 850 represents a substrate to be attached to the first substrate 800 and may be an integrated circuit die, an interposer, a packaging substrate, a high-density interconnect, a printed circuit board, or the like.

For purposes of illustration, the second substrate 850 illustrates an example of a second interconnect structure 851 that may be used for attaching to the first substrate 800. It should be noted, however, that other types of interconnect structures may be utilized to join the first substrate 800 to the second substrate 850. In this example, the second substrate 850 comprises a first passivation layer 854 formed of one or more dielectric layers, such as polyimide, polymer, an oxide, a nitride, and/or the like. In an embodiment, the first passivation layer 854 comprises a composite layer of a layer of silicon nitride having a thickness of about 2,000 Å with an overlying oxide layer having a thickness of about 10,000 Å. The silicon nitride layer may be formed using CVD techniques using silane and ammonia as precursor gases, and the oxide layer may be formed by any oxidation process, such as wet or dry thermal oxidation in an ambient comprising an oxide, $H_2O$, NO, or a combination thereof, or by CVD techniques using TEOS and oxygen as a precursor.

A conductive pad 856 is formed over the first passivation layer 854. The conductive pad 856 may be formed of any suitable conductive material, such as copper, tungsten, aluminum, silver, combinations thereof, or the like. It should be noted that the conductive pad 856 may be a portion of redistribution layer or a through-substrate via. In an embodiment, the conductive pad 856 may be formed using a similar process as discussed above to form conductive pillar 416. For example, a conformal seed layer 858 comprising a layer of titanium having a thickness about 500 Å and a layer of copper having a thickness about 3,000 Å may be formed over the first passivation layer 854. A mask layer may be formed an patterned to define the shape of the conductive pad 856, after which a electroplating process may be used to form a layer of copper having a thickness of about 3 µm to form the conductive pad 856. The mask layer and the excess seed layer may be removed.

Other methods and materials may be used. For example, formation methods may include ECP, electroless plating, or other commonly used deposition methods such as sputtering, printing, and CVD methods, and the conductive materials may include copper alloys, aluminum, silver, gold, combinations thereof, or the like.

One or more second passivation layers, such as a second passivation layer 860, are formed and patterned over the conductive pad 856 as illustrated in FIG. 8. The second passivation layer 860 may be formed of a dielectric material, such as polymer, an oxide, a nitride, or the like, by any suitable method, such as CVD, PVD, or the like. In an embodiment, the second passivation layer 860 comprises a silicon nitride layer having a thickness of about 4,000 Å formed by CVD techniques.

Thereafter, a seed layer 862, a conductive pillar 864, a conductive cap layer 866, and a solder layer 868 are formed on the conductive pad 856. The seed layer 862, the conductive pillar 864, the conductive cap layer 866, and the solder layer 868 may be formed of similar materials using similar techniques as those discussed above with reference to the seed layer 210, the conductive pillar 416, the conductive cap layer 518, and the solder layer 620, respectively. It should be noted, however, that the conductive pillar 864 and the conductive cap layer 866 on the second substrate 850 has a rectangular profile, as opposed to the trapezoidal profile of the conductive bump 416 and the conductive cap layer 518. It should also be noted that the solder layer 868 is a relatively thin solder layer to allow for better connectivity between the first substrate 800 and the second substrate 850 and may reduce or prevent misalignment. An IMC layer 870 may be formed between the solder layer 868 and the cap layer 866.

FIG. 9 illustrates the first substrate 800 and the second substrate 850 after attachment. As illustrated in FIG. 8, a first width $W_1$ of a contact surface of the first interconnect structure 801 of the first substrate 800 is less than a second width $W_2$ of a contact surface of the second interconnect structure 851 of the second substrate 850. In an embodiment, a ratio of the first width $W_1$ to the second width $W_2$ ($W_1/W_2$) is greater than or equal to 0.1 and less than 1.0.

Figure 11:
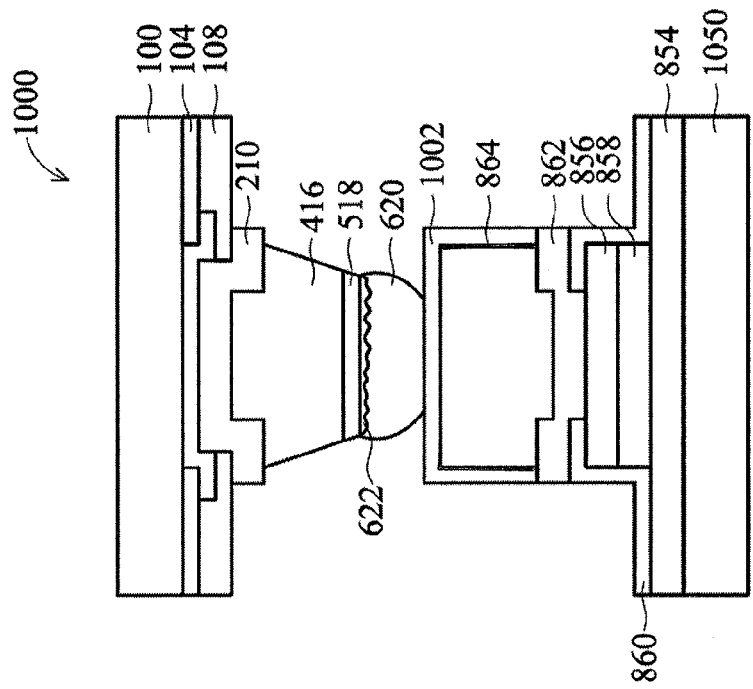
FIGS. 10 and 11 illustrate attaching two substrates in accordance with another embodiment.
Figure 10:
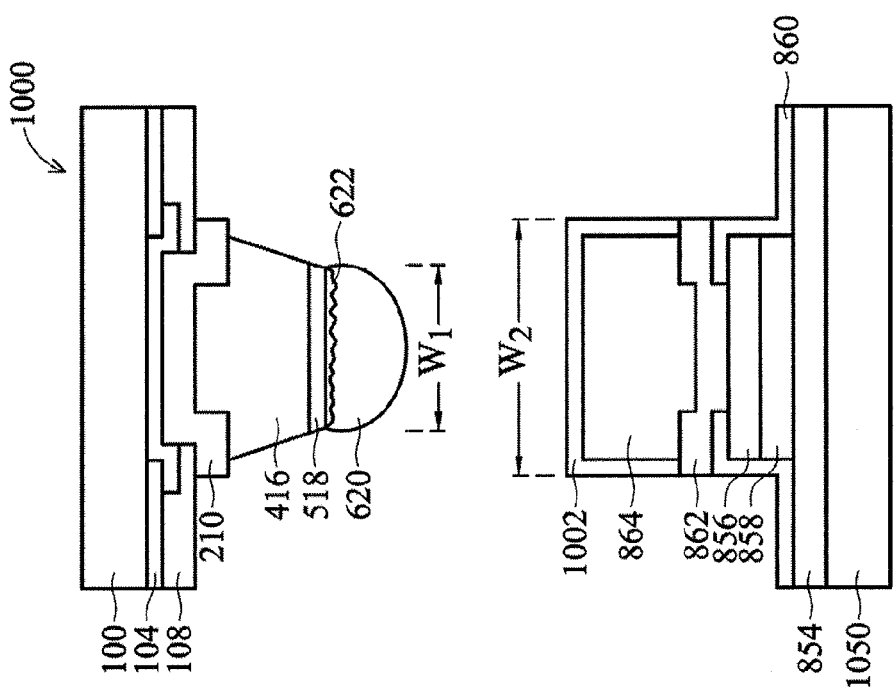

FIGS. 10 and 11 illustrate another embodiment in which two substrates are joined. A first substrate 1000 having a first interconnect structure 1001 represents a substrate such as the substrate 100 discussed above with reference to FIGS. 1-7, wherein like reference numerals refer to like elements. A second substrate 1050 represents a substrate to be attached to the first substrate 1000 via a second interconnect structure 1051 and may be an integrated circuit die, an interposer, a packaging substrate, a high-density interconnect, a printed circuit board, or the like.

The second substrate 1050 illustrated in FIGS. 10 and 11 may be formed of similar materials using similar techniques as those discussed above with reference to the second substrate 850 of FIG. 8, wherein like reference numerals refer to like elements, except the second substrate 1050 omits the conductive cap layer 866 and the solder layer 868. Furthermore, the embodiment illustrated in FIGS. 10 and 11 utilize a finish layer 1002 extending over the top surface and the sidewalls of the conductive pillar 864. In an embodiment, the finish layer 1002 includes nickel layer directly on, and contacting, the conductive pillar 864. Optionally, additional layers may be formed, so that the finish layer 1002 may be an electroless nickel immersion gold (ENIG), a nickel electroless palladium immersion gold (ENEPIG), or a nickel palladium layer. The formation methods of finish layer 1002 include ECP, electroless plating, and the like. FIG. 11 illustrates the first substrate 1000 and the second substrate 1050 after attachment.

Figure 12:
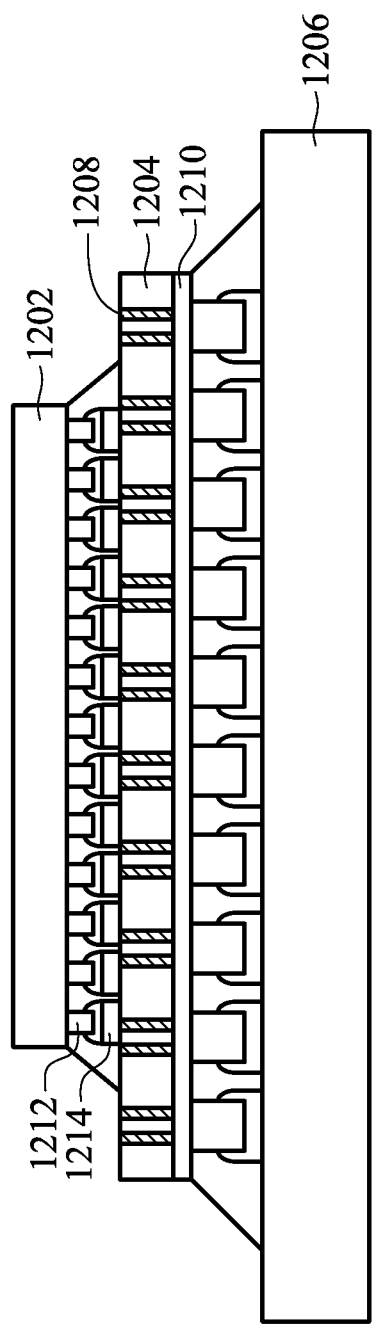
FIG. 12 illustrates a through transition stacking arrangement in accordance with an embodiment.
Figure 13:
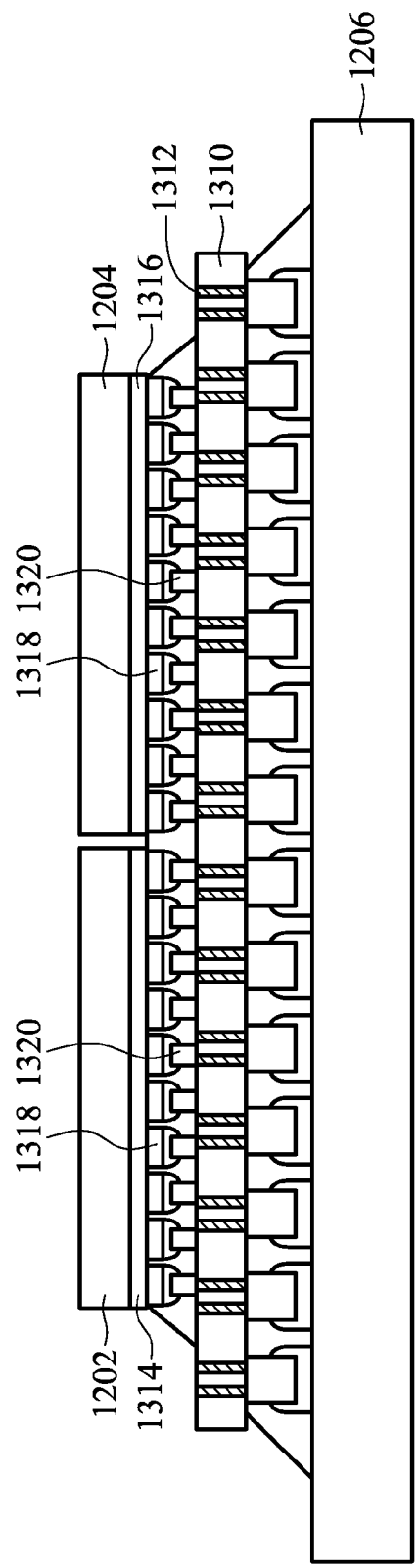
FIG. 13 illustrates a through interposer stacking arrangement in accordance with an embodiment.

FIGS. 12 and 13 illustrate a through transition stacking (TTS) arrangement and a through interposer stacking (TIS) arrangement, respectively, in accordance with embodiments. Generally, the TTS arrangement illustrated in FIG. 12 comprises a first integrated circuit die 1202 and a second integrated circuit die 1204, such that the first integrated circuit die 1202 is attached to the second integrated circuit die 1202, which in turn is attached to a substrate 1206. Through-substrate vias 1208 in the second integrated circuit die 1204 provide an electrical connection between the first integrated circuit die 1202 and contacts on the bottom side of the second integrated circuit die 1204. The first integrated circuit die 1202 and the second integrated circuit die 1204 may be any suitable integrated circuit die. In an embodiment, the first integrated circuit die 1202 is a memory die and the second integrated circuit die 1204 is a logic die, though other dies and combinations may be used.

In the embodiment illustrated in FIG. 12, the second integrated circuit die 1204 is attached to the substrate 1206, which may be a printed circuit board, an interposer, a laminate substrate, a packaging substrate, or the like. In yet another embodiment, the substrate 1206 may be a third integrated circuit die, thereby resulting in a stacked die configuration of three dies.

FIG. 12 also illustrates an embodiment in which the larger of the contact surfaces of the interconnect structures being joined together is positioned on the bottom die. For example, the first integrated circuit die 1202 may have a first interconnect structure 1212 having a width of $W_1$ (see, e.g., FIGS. 8-11) while the second integrated circuit die 1204 may have a second interconnect structure 1214 having a larger width $W_2$ (see, e.g., FIGS. 8-11).

FIG. 12 further illustrates an embodiment in which one of the substrates, e.g., the second integrated circuit die 1204, includes an extremely low-k (ELK) dielectric film 1210, wherein the ELK dielectric film has a dielectric constant less than or equal to about 2.5. In embodiments such as these that utilize ELK dielectric films, it may be desirable to position the interconnect structure having a larger width on the substrate having the ELK dielectric film. It is believed that placing the interconnect structure with the larger width on the substrate having the ELK dielectric film may reduce the joint stress, which in turn may reduce delamination issues related to the joint stress. Thus, in the embodiment illustrated in FIG. 12, the second integrated circuit die 1204 would have the interconnect structure having the larger width. With reference to FIGS. 10 and 11, the second integrated circuit die 1204 may have the interconnect structure having the width $W_2$, while the substrate 1206 to which the second integrated circuit die 1204 is connected would have the interconnect structure having the width $W_1$, wherein $W_2$ is greater than $W_1$.

FIG. 13 illustrates an embodiment similar to the embodiment illustrated in FIG. 12, wherein like reference numerals refer to like elements, except that an interposer 1310 is used. In this embodiment, the first integrated circuit die 1202 and the second integrated circuit die 1204 are attached to the interposer 1310, which in turn is attached to the substrate 1206. Through-substrate vias 1312 in the interposer 1310 provide an electrical connection between the first integrated circuit die 1202, the second integrated circuit die 1204, and/or the substrate 1206.

It should be appreciated that any of the connections used between the first integrated circuit die 1202, the second integrated circuit die 1204, the substrate 1206, and/or the interposer 1310 may utilize a tapered conductive element as discussed above.

FIG. 13 also illustrates an embodiment in which the first integrated circuit die 1202 and the second integrated circuit die 1204 includes ELK films 1314 and 1316, respectively. As discussed above, in embodiments in which ELK films are being used, it is believed that placing the larger of the interconnect structures being joined together on the substrate having the ELK films may reduce the delamination issues of the ELK films related to the joint stress. Thus, the first integrated circuit die 1202 and the second integrated circuit die 1204 may have interconnect structures 1318 having the width $W_2$ (see, e.g., FIGS. 8-11), while the interposer 1310 to which the first integrated circuit die 1202 and the second integrated circuit die 1204 are connected would have an interconnect structure 1320 having the width $W_1$ (see, e.g., FIGS. 8-11), wherein $W_2$ is greater than $W_1$.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:
1. A device comprising:
 a first substrate having a first conductive pillar and a first conductive cap layer over the first conductive pillar, the first conductive pillar having tapered sidewalls extend- ing from an upper surface, the first conductive cap layer having a first width W1, the first conductive cap layer extending over only the upper surface of the first conductive pillar, the first conductive cap layer having tapered sidewalls;

a second substrate having a conductive pad and a passivation layer, the passivation layer covering at least a portion of the conductive pad, the second substrate further comprising a second conductive pillar extending through the passivation layer and contacting the conductive pad, the second conductive pillar having a second conductive cap layer extending over a top surface and sidewalls of the second conductive pillar, the second conductive cap layer having a contact surface, the contact surface having a second width W2, wherein the first width W1 is less than the second width W2; and a conductive material attaching the first conductive cap to the contact surface.

2. The device of claim 1, wherein second substrate comprises an extremely low-k dielectric layer.

3. The device of claim 1, wherein the first substrate is a first integrated circuit die and the second substrate is a second integrated circuit die.

4. The device of claim 1, wherein the first conductive pillar has a trapezoidal pattern.

5. The device of claim 1, wherein at least one of the first substrate and the second substrate is an integrated circuit die and the other substrate is an interposer, packaging substrate, high-density interconnect, or printed circuit board.

6. The device of claim 1, wherein the first substrate comprises an integrated circuit die and the second substrate is an interposer.

7. The device of claim 1, wherein the first conductive pillar has a trapezoidal shape.

8. A method of forming a device, the method comprising: providing a first substrate having a first interconnect structure formed thereon, the first interconnect structure having a first width; the first interconnect structure comprising a multi-layer pillar, wherein the providing the first substrate comprises:

providing the first substrate having a bond pad;

forming a patterned mask over the bond pad, the patterned mask having an opening, the opening having tapered sidewalls such that a width of the opening narrows as the opening extends away from the bond pad;

forming a copper pillar, a conductive cap layer over the copper pillar, a solder layer over the conductive cap layer within the opening such that the copper pillar, the conductive cap layer, and the solder layer have tapered sidewalls, the conductive cap layer extending only over an upper surface of the copper pillar; and after the forming the copper pillar, the conductive cap layer, and the solder layer, removing the patterned mask;

providing a second substrate having a second interconnect structure formed thereon, the second interconnect structure having a second width different than the first width, the second interconnect structure having a conductive pillar with a conductive finish layer extending over sidewalls of the conductive pillar; and attaching the first interconnect structure of the first substrate to the second interconnect structure of the second substrate.

9. The method of claim 8, wherein at least one of the first interconnect structure and the second interconnect structure has a trapezoidal shape.

10. The method of claim 8, wherein the first substrate comprises an extremely low-k dielectric layer and the first width is greater than the second width.

11. The method of claim 8, further comprising:
attaching one of the first substrate and the second substrate to a third substrate;
wherein the first substrate comprises a first integrated circuit die and the second substrate comprises a second integrated circuit die, wherein one integrated circuit die of the first integrated circuit die and the second integrated circuit die being interposed between the third substrate and the other integrated circuit die of the first integrated circuit die and the second integrated circuit die, the one integrated circuit die having an interconnect structure wider than an interconnect structure of the other integrated circuit die.

12. The method of claim 8, wherein at least one of the first substrate and the second substrate is an interposer.

13. A method of forming a device, the method comprising:
providing a first substrate, the first substrate having a first bond pad formed thereon;
forming a passivation layer over the first substrate and at least a portion of the first bond pad;
forming a patterned mask over the passivation layer, the patterned mask having an opening over the first bond pad, the opening having a width at an uppermost surface of the patterned mask greater than at a location closer to the first bond pad;
forming a first conductive pillar within the opening, an uppermost surface of the first conductive pillar having a first width;
forming a first solder material over the first conductive pillar within the opening;
removing the patterned mask; and
providing a second substrate having an interconnect structure, the interconnect structure having a second width different than the first width;
forming a second solder material; and
attaching the second substrate to the first substrate, the second solder material being in direct contact with the first solder material on the first substrate.

14. The method of claim 13, further comprising:
providing a second substrate having an interconnect structure, the interconnect structure having a second width different than the first width; and
attaching the second substrate to the first substrate, the interconnect structure being in direct contact with the first solder material on the first substrate.

15. The method of claim 14, wherein the interconnect structure comprises a second conductive pillar with a conductive finish layer extending over sidewalls of the second conductive pillar.

16. The method of claim 13, wherein the interconnect structure comprises a second conductive pillar with a conductive finish layer extending over sidewalls of the second conductive pillar.

17. The method of claim 16, wherein the first substrate comprises an integrated circuit.

18. The method of claim 17, wherein the second substrate comprises an integrated circuit.

19. The method of claim 17, wherein the second substrate comprises an interposer.

* * * * *